United States Patent
Shin et al.

(10) Patent No.: US 8,173,217 B2
(45) Date of Patent: May 8, 2012

(54) CARBON NANO-TUBE FILM WITH A TRANSFORMED SUBSTRATE STRUCTURE AND A MANUFACTURING METHOD THEREOF

(75) Inventors: Hyeon Jin Shin, Suwon-si (KR); Seonmi Yoon, Yongin-si (KR); Jaeyoung Choi, Suwon-si (KR); Jin Seung Sohn, Seoul (KR); Eun Hyoung Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/854,386

(22) Filed: Aug. 11, 2010

(65) Prior Publication Data

US 2010/0316813 A1    Dec. 16, 2010

Related U.S. Application Data

(62) Division of application No. 12/055,755, filed on Mar. 26, 2008, now Pat. No. 7,881,667.

(30) Foreign Application Priority Data

Sep. 4, 2007  (KR) .................. 10-2007-0089464

(51) Int. Cl.
   *B05D 3/00*    (2006.01)
(52) U.S. Cl. ........................ 427/275; 427/554
(58) Field of Classification Search .................. None
   See application file for complete search history.

(56) References Cited

U.S. PATENT DOCUMENTS

| | | | |
|---|---|---|---|
| 6,988,925 B2 | 1/2006 | Arthur et al. | |
| 7,147,534 B2 | 12/2006 | Chen et al. | |
| 2006/0279843 A1 | 12/2006 | Kurt et al. | |
| 2007/0154714 A1 | 7/2007 | Mirkin et al. | |

FOREIGN PATENT DOCUMENTS

| | | |
|---|---|---|
| JP | 2002-373570 | 12/2002 |
| JP | 200575711 | 3/2005 |
| KR | 1020060117074 | 11/2006 |
| WO | 2005029528 | 3/2005 |

OTHER PUBLICATIONS

Meitl et al., Solution Casting and Transfer Printing SWCNT films, Nano Letters, Jul. 2004, 4(9), p. 1643-1647.
Chen, Fabrication and evaluation of CNT-parylene functional composite films, IEEE, Jun. 2007, p. 1019-1022.
Lagemaat et al., Organic solar cells with carbon nanotubes replacing In2O3:Sn as the transparent electrode, Applied Physics Letters, 88, Jun. 2006, p. 233503.
Puetz and Aegerter, Direct gravure printing of indium tin oxide nanoparticle patterns on polymer foils, Thin Solid Films, Jun. 2007, p. 4495-4501.

*Primary Examiner* — Timothy Speer
(74) *Attorney, Agent, or Firm* — Cantor Colburn LLP

(57) ABSTRACT

A carbon nanotube (CNT) film having a transformed substrate structure and a manufacturing method thereof. The CNT film includes a transparent substrate, a plurality of three-dimensional (3D) structures formed distant from each other on the transparent substrate, and carbon nanotubes (CNTs) deposited on the transparent substrate where the plurality of 3D structures is not formed. The method includes forming a plurality of 3D structures distant from each other on a transparent substrate, and depositing a CNT solution on the substrate with the plurality of 3D structures formed thereon, wherein the CNT solution is deposited into a portion of the transparent substrate where the 3D structures are not formed. Thus, the deposition mechanism of the CNT solution is controlled to thereby increase the transparency of the CNT film and the electrical conductivity of an electrode including the CNT film.

9 Claims, 9 Drawing Sheets

CNT Solution Wetting

CNT Solution Wetting

CNT Solution Wetting

CNT Solution Wetting

CNT Solution Wetting

CARBON NANO-TUBE FILM WITH A TRANSFORMED SUBSTRATE STRUCTURE AND A MANUFACTURING METHOD THEREOF

This application is a divisional of U.S. application Ser. No. 12/055,755, filed on Mar. 26, 2008, which claims priority to Korean Patent Application No. 10-2007-0089464 filed on Sep. 4, 2007, and all of the benefits accruing therefrom under 35 U.S.C. §119, the contents of which in its entirety are herein incorporated by reference.

BACKGROUND OF THE INVENTION

1. Field of the Invention

The present invention relates to a carbon nanotube ("CNT") film having a transformed substrate structure and a manufacturing method thereof. More particularly, to a CNT film with a transformed substrate structure and a manufacturing method thereof in which the substrate structure is transformed by a structure formed on the substrate, and a CNT solution is applied thereto to form a patterned CNT film to thereby increase the transparency of the CNT film and the electrical conductivity of an electrode manufactured using the CNT film.

2. Description of the Related Art

A display requires a transparent electrode which is electrically conductive. Currently, the transparent electrode used is made of an Indium Tin Oxide ("ITO"). Several problems occur with the use of ITO electrode, in that as the consumption of Indium is increased, the cost is increased, and that resistance thereof increases due to cracks occurring especially when bending an ITO electrode, which case is hardly applied to a flexible device.

Thus, it is desired to develop a transparent electrode applicable to a flexible device, and recently a CNT transparent electrode has been used. A CNT transparent electrode has excellent electrical conductivity and strength, and flexibility, so that the flexible transparent electrode using the CNT can be widely applicable as an electrode material to an energy device such as solar cells or secondary cells as well as a display device such as an existing liquid crystal to display ("LCD"), an organic light emitting diode ("OLED"), and a paper like display.

The most important characteristics of the CNT transparent electrode may be electrical conductivity, transparency, and flexibility. Generally, the CNT transparent electrode is manufactured in such a manner that CNT powders are dispersed in a solution including a dispersing agent to prepare a CNT solution, and a plastic substrate is applied with the CNT solution. The important one to improve the conductivity of the CNT transparent electrode is that carriers move CNT itself and freely move between the CNTs.

If the amount of the CNTs in a transparent electrode composed of a CNT network structure is greatly sufficient to bring into contact between CNTs, i.e., above a percolation threshold, resistance of CNT itself hardly affects a CNT network structure film, whereas contact resistance between CNTs mainly has influence upon resistance of the CNT network structure film. Thus, the formation of the CNT network structure and the reduction in contact resistance between CNTs are very important to improve the conductivity of the CNT transparent electrode.

However, the CNT transparent electrode has a limit to obtain high conductivity at high permeability because the CNT solution is applied onto the whole electrode substrate. Thus, the present invention is intended to improve the permeability as compared to the case having the same conductivity through a structure control that is, forming a pattern on the transparent substrate to have a portion on which the CNT solution exists and a transparent portion on which the CNT solution does not exist. Herein, if the CNTs are to serve as an electrode, the structure of the transparent portion should be controlled such that all the CNTs on the substrate are connected together.

BRIEF SUMMARY OF THE INVENTION

The present invention has been made to solve the above-stated problems and aspects of the present invention provide a CNT film and a manufacturing method thereof in which a substrate structure is transformed by a structure formed on the substrate, and a CNT solution is applied thereto to form a patterned CNT film, to thereby increase the electrical conductivity of an electrode manufactured using the CNT film.

According to an exemplary embodiment, the present invention provides a CNT film having a transformed substrate structure and a manufacturing method thereof in which the substrate structure is transformed by a structure formed on the substrate, and a CNT solution is applied thereto to form a patterned CNT film, to thereby reduce contact resistance between CNTs, increase the transparency of the CNT film and the electrical conductivity of an electrode manufactured using the CNT film.

According to an exemplary embodiment of the present invention, when a three-dimensional (3D) structure is formed on a substrate to transform the shape of the substrate, and a CNT solution is applied thereto, the CNT solution is laminated into a portion where the 3D structure is not formed due to a difference in potential energy for the curved face of the structure, and a capillary force between CNTs.

A nano size 3D nanotube can be formed with a method using such as a nano imprint operation, a laser operation, an etching operation, a photolithography operation, etc., and a patterned CNT film can also be manufactured only by the application of the CNT solution due to the position selectivity of the CNT solution for the substrate.

In this way, a CNT deposition mechanism can be controlled by the 3D structure formed on the substrate, and the transparency of the substrate can also be improved by the structure formed on the substrate and the position selectivity of the CNT solution.

According to an exemplary embodiment, the present invention provides a CNT film having a transformed substrate structure including a transparent substrate, a plurality of three-dimensional (3D) structures formed distant from each other on the transparent substrate, and carbon nanotubes (CNTs) deposited on the transparent substrate where the plurality of 3D structures is not formed.

According to an exemplary embodiment, the plurality of 3D structures each have one or more shape selected from a group including a cone, a semi-sphere, a polypyramid, a polyprism, and a cylinder, a diameter of a contact portion between the 3D structure. The transparent substrate may be of a nano size, and the surface of the 3D structure may be surface-treated with a material having an opposite polarity relative to a CNT solution to be deposited. In an exemplary embodiment, the CNT solution may be a solution dispersed in water or organic system, or a solution dispersed in water or organic system containing CNTs or dispersing agent.

According to another exemplary embodiment, the present invention provides a method of manufacturing a carbon nanotube (CNT) film having a transformed substrate structure, the method includes forming a plurality of three-dimensional (3D) structures distant from each other on a transparent substrate, and depositing a CNT solution on the substrate with the plurality of 3D structures formed thereon, wherein the CNT solution is deposited into a portion of the transparent substrate where the 3D structures are not formed.

According to an exemplary embodiment, the method further includes treating the surface of the 3D structure having a material having an opposite polarity relative to the to-be-deposited CNT solution before depositing the CNT solution on the substrate with the 3D structure formed thereon.

Further, according to an exemplary embodiment, the method further includes removing the CNTs deposited on the surface of the 3D structure after depositing the CNT solution on the substrate with the 3D structure formed thereon.

According to an exemplary embodiment, the present invention provides a carbon nanotube (CNT) electrode including the CNT film having the above-construction, and a thin film transistor ("TFT") using the CNT film as a channel material.

According to an exemplary embodiment of the present invention, the substrate structure is transformed by the structure formed on the substrate, and the CNT solution is deposited thereon to thereby form the CNT film, so that a patterned porous CNT film can be efficiently obtained. Further, a large-scaled patterned CNT thinning can be obtained by using the technology of controlling the substrate structure.

Further, according to an exemplary embodiment of the present invention, contact resistance between the CNTs is reduced, the transparency of the CNT film is increased, and the electrical conductivity of an electrode manufactured using such a CNT film is increased.

Meanwhile, such a patterned porous CNT film is applicable to diverse devices such as TFT and OLED as well as the CNT electrode.

BRIEF DESCRIPTION OF THE DRAWINGS

The above and/or other aspects, features and advantages of the present invention will become apparent from the following detailed description taken in conjunction with the accompanying drawings, in which.

DETAILED DESCRIPTION OF THE INVENTION

Figure 1A:
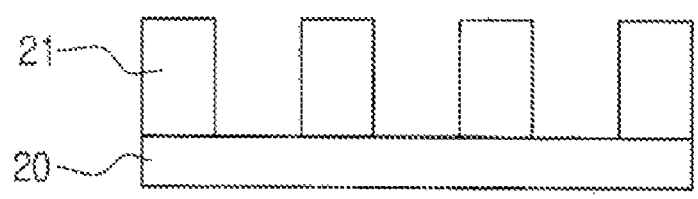
FIG. 1A through 1C are sectional views illustrating an exemplary embodiment of an operation of forming the patterned CNT film by transforming a substrate structure by a three-dimensional (3D) structure having a flat upper face according to the present invention.
Figure 1A:
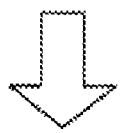
Figure 1A:
Figure 1A:
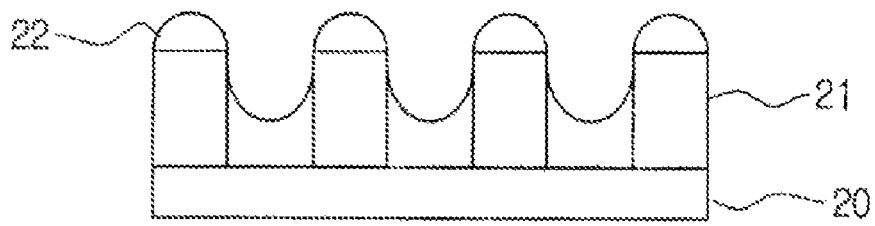

The invention is described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1B:
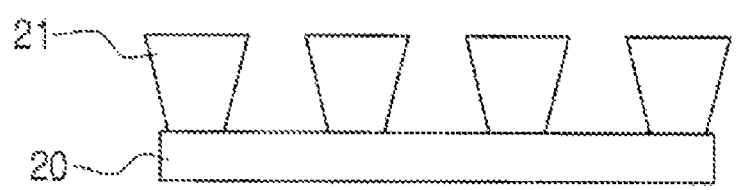
Figure 1B:
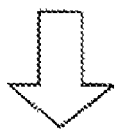
Figure 1B:
Figure 1B:
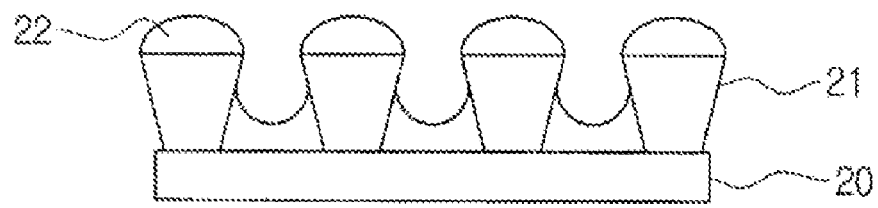
Figure 1C:
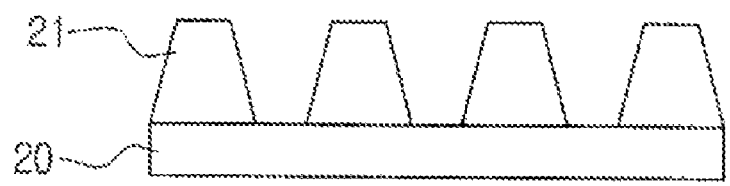
Figure 1C:
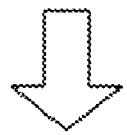
Figure 1C:
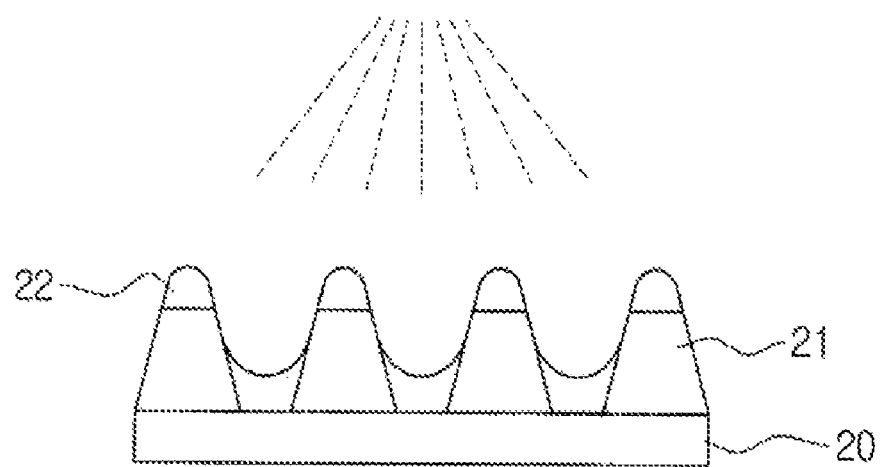

FIG. 1A to 1C are sectional views illustrating an exemplary embodiment of an operation of forming a patterned carbon nanotube (CNT) film by transforming a substrate structure by a three-dimensional (3D) structure with a flat upper face according to the present invention.

As illustrated in FIG. 1A, a cylindrical type 3D structure 21 is formed on a transparent substrate 20 using a nano imprint operation, a laser operation, an etching operation, or a photolithography operation, to thereby transform the shape of the transparent substrate 20. That is, a cylindrically patterned substrate is manufactured. Then, a CNT solution 22 is sprayed onto the transformed substrate 20 so that the CNT solution is deposited on both a portion of the transparent substrate 20 without the cylindrical 3D structure 21 and an upper face of the cylindrical 3D structure 21.

Since the upper face of the cylindrical 3D structure 21 formed on the transparent substrate 20 is a flat surface, the CNT solution 22 is deposited and remains on the upper face of the 3D structure 21 as well as the portion of the transparent substrate 20 where the 3D structure 21 is not formed. Thus, resulting in an increase in roughness of the CNT film, so that an additional operation is needed for removing the CNT solution 22 remaining on the upper face of the 3D structure 21.

However, although a difference in potential energy and a capillary force do not exist because the upper face of the 3D structure 21 has no curved portion, thus, the CNT solution 22 is deposited into the portion of the transparent substrate 20 where the 3D structure 21 is not formed. Most of CNT solution 22 remaining on the upper face of the 3D structure 21 can be removed by washing the upper face with deionized water (i.e., DI water) or a solvent such as an organic solvent, or washing it in tapping manner.

Referring further to FIGS. 1B and 1C, like in FIG. 1A, illustrated is an exemplary embodiment of a transformed substrate structure in which a 3D structure 21 having a flat upper face is formed on the transparent substrate 20. Both cases have the same conditions excluding that in FIG. 1A, the areas of the upper face and lower face of the 3D structure 21 are the same, whereas in FIGS. 1B and 1C, those areas are different from each other. Thus, the processing principles in FIG. 1A are identically applied to the cases of FIGS. 1B and 1C. However, in these structures, the deposition of a thin film can be controlled in such a manner that CNTs are introduced into a portion where the structures do not exist by using an operation of deteriorating affinity for the CNT solution 22 through surface treatment of the structures.

Figure 2A:
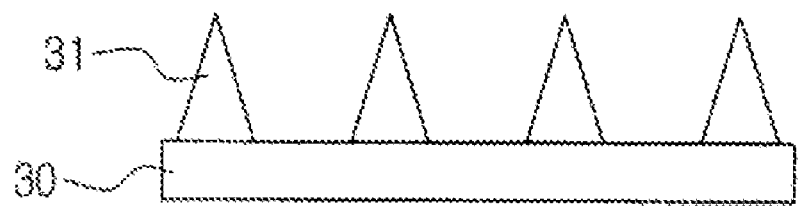
FIGS. 2A and 2B are sectional views illustrating an exemplary embodiment of an operation of forming the patterned CNT film by transforming a substrate structure by a three-dimensional (3D) structure having a curved upper face according to the present invention.
Figure 2A:
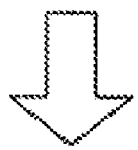
Figure 2A:
Figure 2A:
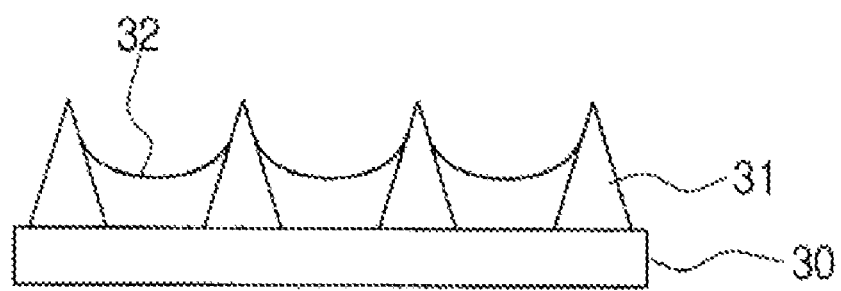
Figure 2B:
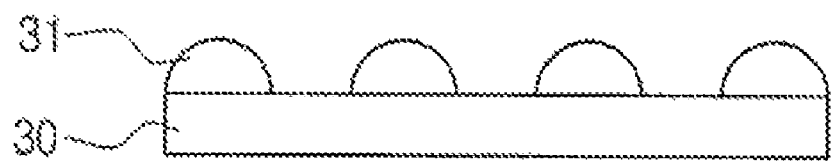
Figure 2B:
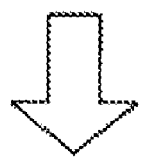
Figure 2B:
Figure 2B:
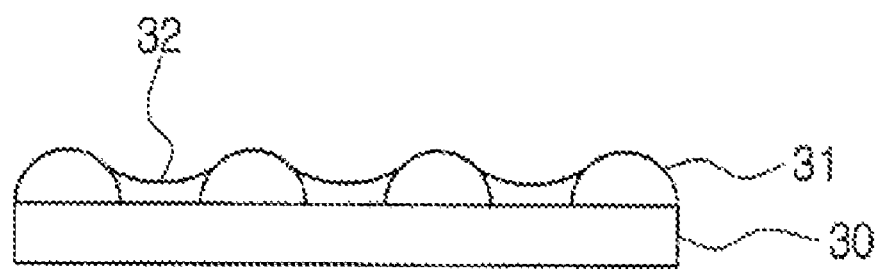

FIGS. 2A and 2B are sectional views illustrating an exemplary embodiment of an operation of forming a patterned CNT film by transforming a substrate structure by a 3D structure having a curved upper face according to the present invention.

As illustrated in FIG. 2A, a conical type 3D structure 31 is formed on a transparent substrate 30 using a nano imprint operation, a laser operation, an etching operation, or a photolithography operation, to thereby transform the shape of the transparent substrate 30. Then, a CNT solution 32 is sprayed onto the transformed substrate so that the CNT solution is deposited on both a portion of the transparent substrate 30 without the conical 3D structure 31 and an upper face of the conical 3D structure 31.

According to the current exemplary embodiment, since the upper face of the conical 3D structure 31 formed on the transparent substrate 30 is a curved surface having a pointed tip and bendings, the CNT solution 32 is deposited into the portion of the transparent substrate 30 without the conical 3D structure 31 due to a capillary force for an interface therebetween.

Thus, with a control of a deposition mechanism of the CNT solution 32, the selectivity of the CNT solution 32 for the substrate is provided, and the CNT film is patterned, so that the transparency of the CNT film is increased.

FIG. 2B illustrates a transformed substrate structure in which a 3D structure 31 having a curved upper face is formed on the transparent substrate 30. Both embodiments in FIGS. 2A and 2B have the same conditions excluding that in FIG. 2A, the tip portion of the upper face of the 3D structure 31 is pointed, whereas in FIG. 2B, the upper face of the 3D structure 31 is curved like a semi-sphere. Thus, the processing principles in FIG. 2A are identically applied to the case of FIG. 2B.

In this way, it may be most preferable that a CNT film having a random network structure formed by CNTs be generally formed by applying, onto a substrate 30, a CNT dispersing solution 32 obtained by dispersing the CNTs in a solvent.

The CNT dispersing solution 32 is prepared using an operation as follows. First, high purity CNTs of approximately 1 mg and 10 mL N-methylpyrrolidone (NMP) are provided in order into a 20 ml glass vessel, and then the vessel is processed with a sonic-treatment for 10 hours in a supersonic bath. Then, the CNT-NMP solution is provided into a 50 mL conical tube and is centrifugally separated at 10,000 rpm for 10 minutes. After centrifugal separation, only a CNT solution 32 that is not precipitated is taken to thereby prepare the CNT dispersing solution 32.

Next, the CNT film with CNT random network structure is manufactured with a spraying method in which the CNT dispersing solution prepared is coated onto the transformed structure substrate by using a spraying device. According to an exemplary embodiment, a spin coating operation or an ink-jet printing operation, for example, can be used.

Figure 3A:
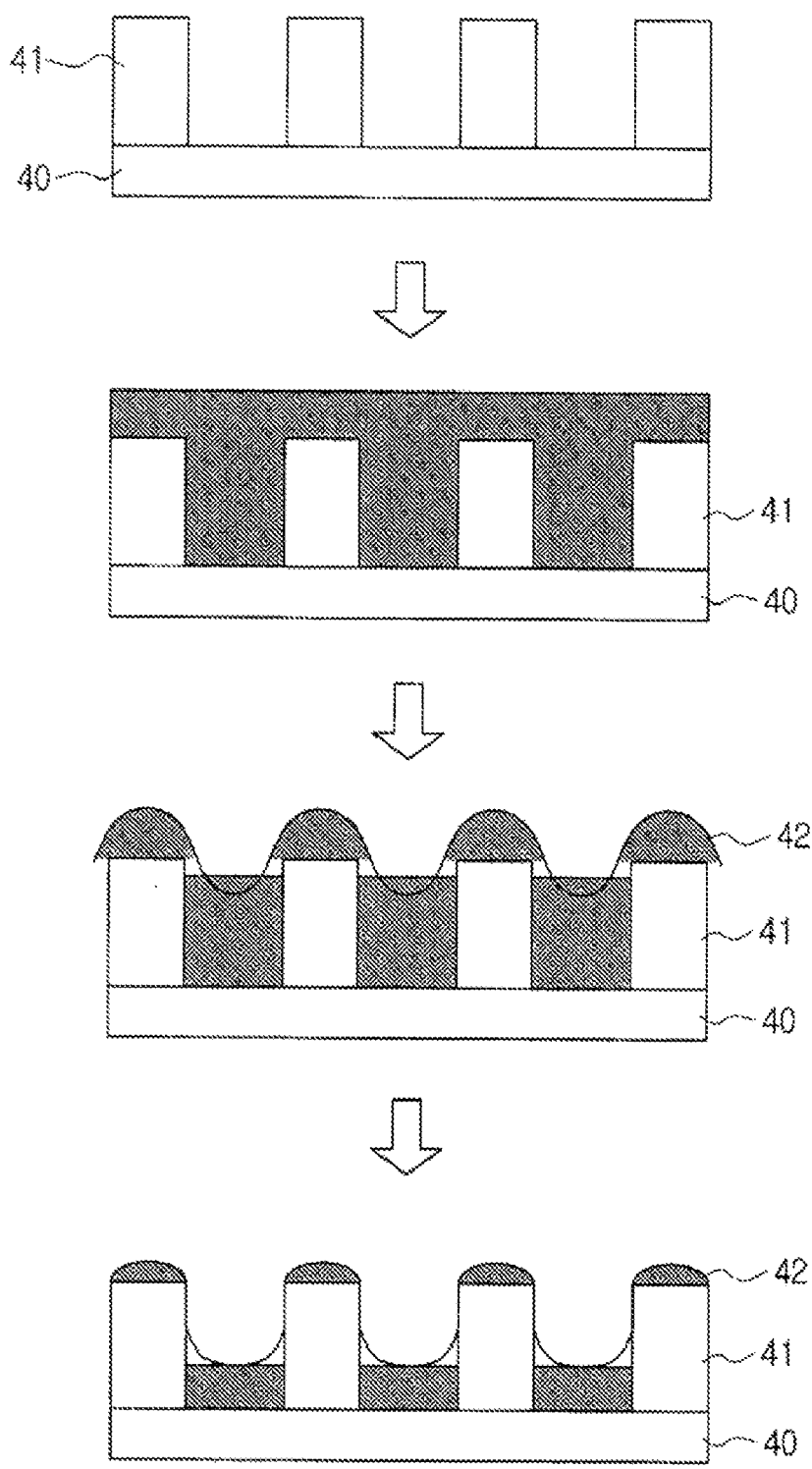
FIG. 3A is a sectional view illustrating an exemplary embodiment of a mechanism of depositing a CNT solution on a substrate having a three-dimensional (3D) structure (cylinder type) having a flat upper face according to the present invention.

FIG. 3A is a sectional view illustrating an exemplary embodiment of a mechanism of depositing a CNT solution on a substrate having a 3D structure (cylinder type) having a flat upper face according to of the present invention.

As illustrated in FIG. 3A, an operation of the deposition mechanism of the CNT solution onto the substrate transformed by the 3D structure is as follows.

A cylindrical type 3D structure 41 is formed on a transparent substrate 40, to thereby manufacture a transformed type substrate. According to an exemplary embodiment, the 3D structure 41 may be of a polypyramid or a polyprism having a flat upper face, other than the cylindrical shape. As previously described, the 3D structure can be formed using a nano imprint operation, an etching operation, or a photolithography operation, and for more precise designing, a laser operation may be additionally required.

Next, a CNT solution 42 is sprayed onto the substrate 40 transformed by the 3D structure 41 having a flat upper face so that the CNT solution 42 is deposited on both a portion of the transparent substrate 40 without the 3D structure 41 and the upper face of the 3D structure 41, i.e., the whole surface of the transformed substrate 40.

Then, meniscuses of the CNT solution 42 occur along the surface of the transformed substrate 40, and thus, the CNT solution 42 deposited on the upper face of the 3D structure 41 still remains thereon because the upper face of the 3D structure 41 is a flat face.

Figure 3B:
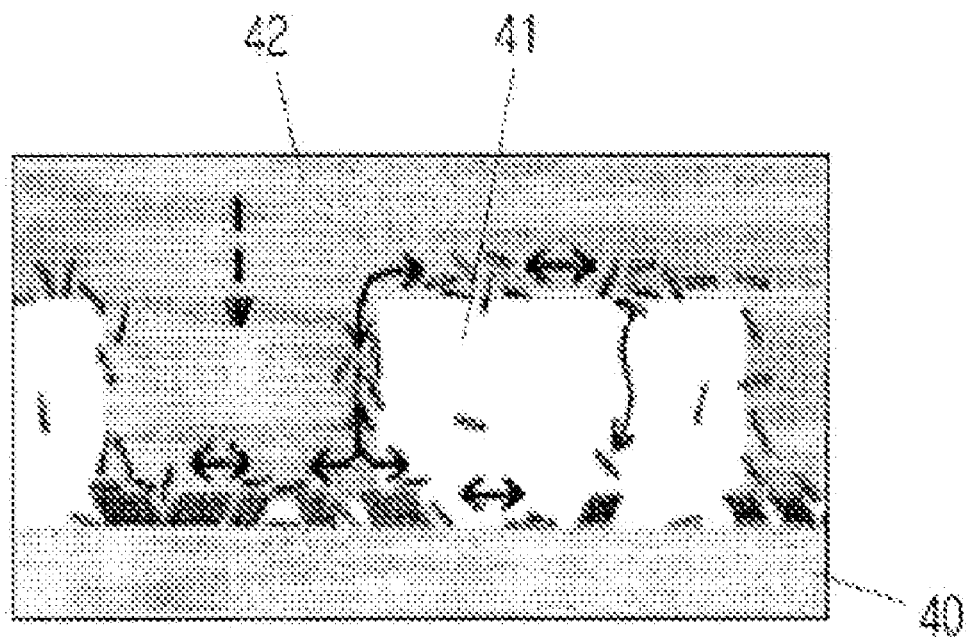
FIG. 3B is a view illustrating an exemplary embodiment of a phenomenon in which a capillary force occurs during the deposition mechanism of the CNT solution according to the substrate structure of FIG. 3A, according to the present invention.

However, the CNT solution 42 is deposited into the portion of the transparent substrate 40 where the 3D structure 41 is not formed, and such a mechanism is illustrated in detail in FIG. 3B.

FIG. 3B is a view illustrating an exemplary embodiment of a phenomenon in which a capillary force occurs during the deposition mechanism of the CNT solution according to the substrate structure of FIG. 3A, according to the present invention. As illustrated in FIG. 3B, the CNT solution 42 is deposited into the portion of the transparent substrate 40 having no 3D structure 41 due to a capillary force denoted as an arrow, so that the CNT solution 42 deposited on the transformed substrate 40 is collected onto the portion of the transparent substrate 40 having no 3D structure 41.

Figure 4A:
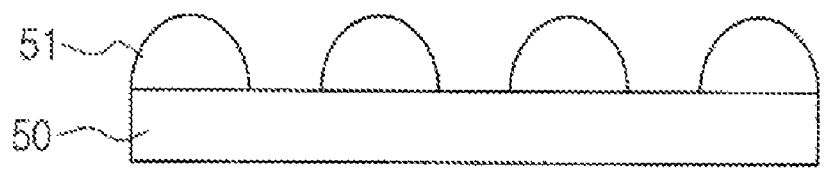
FIG. 4A is a sectional view illustrating an exemplary embodiment of a mechanism of depositing a CNT solution on a substrate having a three-dimensional (3D) structure (semi-sphere type) having a curved upper face according to the present invention.
Figure 4A:
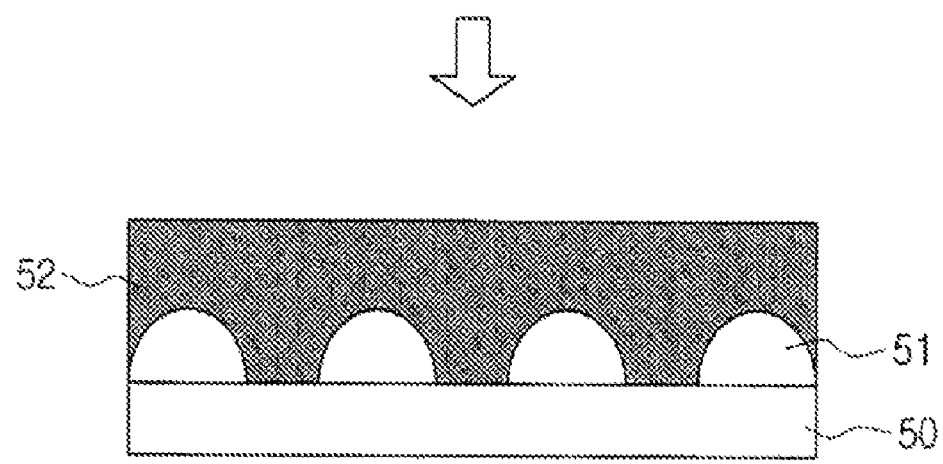
Figure 4A:
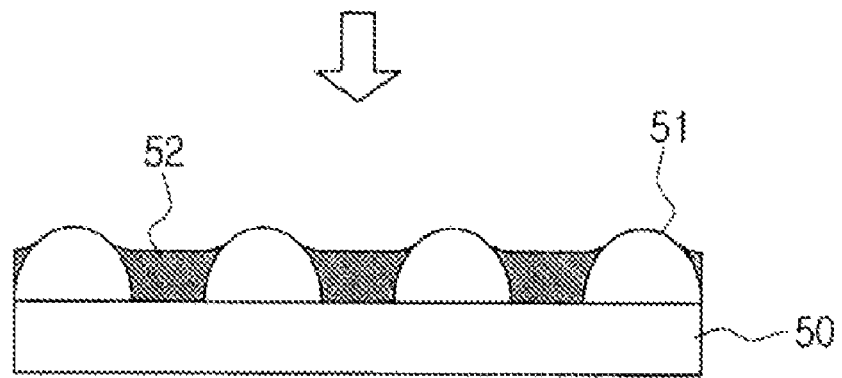

FIG. 4A is a sectional view illustrating an exemplary embodiment of a mechanism of depositing a CNT solution on a substrate having a 3D structure (semi-sphere type) having a curved upper face according to the present invention.

As illustrated in FIG. 4A, an operation of the deposition mechanism of the CNT solution 52 onto the substrate transformed by the 3D structure 51 is as follows.

First, a semi-spherical type 3D structure 51 is formed on a transparent substrate 50, to thereby manufacture a transformed type substrate. According to an exemplary embodiment, the 3D structure 51 may be of a conical type with a curved upper face, other than the semi-spherical shape. As previously described, the 3D structure 51 can be formed using a nano imprint operation, an etching operation, or a photolithography operation, and for more precise designing, a laser operation may be additionally required.

Next, a CNT solution 52 is sprayed onto the substrate 50 transformed by the 3D structure 51 with a curved upper face so that the CNT solution 52 is deposited on both a portion of the transparent substrate 50 without the 3D structure 51 and the upper face of the 3D structure 51, i.e., the whole surface of the transformed substrate 50.

Then, meniscuses of the CNT solution 52 occur along the surface of the transformed substrate 50, and thus, the CNT solution 52 does not remain on the upper face of the 3D structure 51 because the upper face of the 3D structure 51 is a curved face.

Figure 4B:
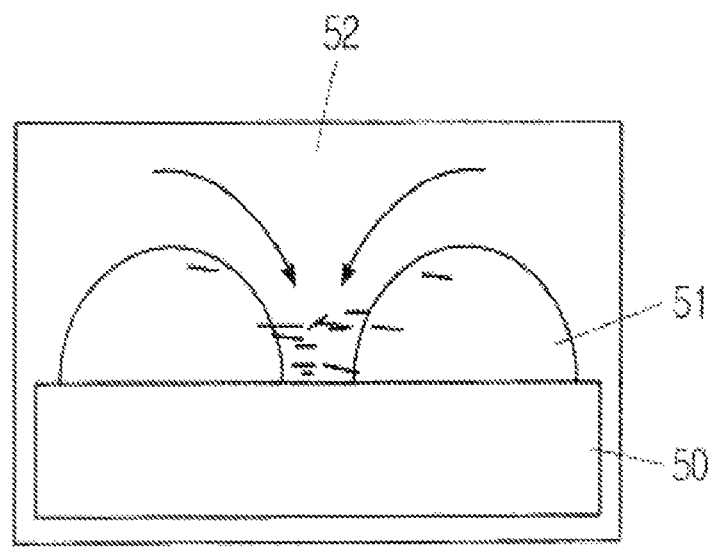
FIG. 4B is a view illustrating an exemplary embodiment of a phenomenon in which a capillary force occurs during the deposition mechanism of the CNT solution according to the substrate structure of FIG. 4A.

That is, the CNT solution 52 is deposited into the portion of the transparent substrate 50 where the 3D structure 51 is not formed, and such a mechanism is illustrated in detail in FIG. 4B.

FIG. 4B is a view illustrating an exemplary embodiment of a phenomenon in which a capillary force occurs during the deposition mechanism of the CNT solution according to the substrate structure of FIG. 4A, according to the present invention.

As illustrated in FIG. 4B, the CNT solution 52 is deposited into the portion of the transparent substrate 50 having no 3D structure 51 due to a capillary force denoted as an arrow, so that the CNT solution 52 deposited on the transformed substrate is collected onto the portion of the transparent substrate 50 having no 3D structure 51.

As previously described with reference to FIGS. 1A-4B, when the CNT film is formed by depositing the CNT solution 22, 32, 42, 52 onto the substrate 20, 30, 40, 50 transformed by forming the 3D structure 21, 31, 41, 51, the CNT deposition mechanism is shown in diverse forms according to the shape of the 3D structure 21, 31, 41, 51.

That is, in case of FIG. 3A in which the upper face of the 3D structure 41 is a flat face, although the CNT solution 42 is deposited into the portion of the transparent substrate 40 having no 3D structure 41 due to a capillary force, a portion of the CNT solution 42 deposited on the upper face of the 3D structure 41 still remains thereon because the upper face of the 3D structure 41 is a flat face (i.e., without bendings). Such a problem can be solved in a manner to be described in connection with FIG. 5.

On the contrary, in case of FIG. 4A in which the upper face of the 3D structure is a curved face, as the CNT solution 52 is deposited into the portion of the transparent substrate 50 having no 3D structure 51 due to a capillary force, the CNT solution 52 does not remain on the upper face of the 3D structure 51, and is only collected onto the transparent substrate 50 having no 3D structure.

According to an exemplary embodiment of the present invention, a distance, i.e., a pitch size, between adjacent 3D structures is approximately 100 nm to approximately 10,000 nm (10 μm), and assuming that the pitch size is 1, an area ratio of the portion having the 3D structure to the portion having no structure is 1:1 to 1:9. In case of upper limit in which the pitch size is approximately 10 μm, and the area ratio is approximately 1:9 (9 μm) or more, which case means the structures have the largest sizes, if used as an electrode, it may cause inconstant voltage (LCD)/current (OLED) error. Further, in case of lower limit in which the pitch size is approximately 100 nm, and the area ratio is approximately 1:9 (10 nm) or less, which case means the structures have the smallest sizes, if used as an electrode, the offset effect of the transparency that is reduced by a scattering by CNTs cannot be checked because the size of the transparent portion is too small.

Figure 5:
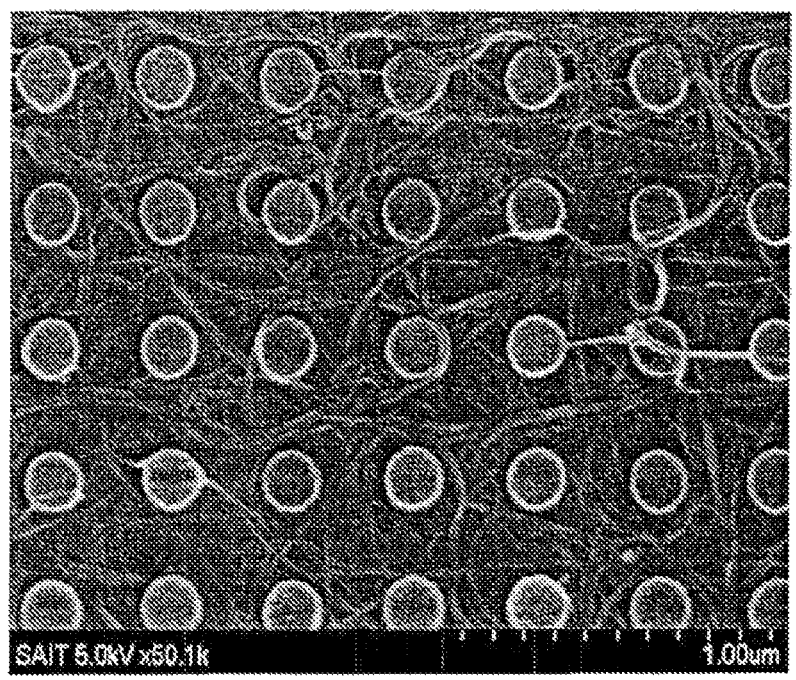
FIG. 5 is a photograph illustrating an exemplary embodiment of an after-washed patterned CNT film manufactured by transforming a shape of a substrate by a 3D structure according to the present invention.

FIG. 5 is a photograph illustrating an exemplary embodiment of an after-washed patterned CNT film manufactured by transforming a shape of a substrate by a 3D structure according to the present invention.

In this way, the deposition of a thin film can be controlled in such a way that according to the embodiments of the present invention, the substrate is transformed by the 3D structure, and the structure is surface-treated using non-polar fluorine based compound in order to remove affinity with the CNTs dispersed in a polar solution to thereby introduce the CNTs into the portion having no structure.

In manufacturing the patterned CNT film, as set forth above, the roughness can be sufficiently reduced due to a capillary force only by depositing the CNT solution on the substrate transformed by the 3D structure. Herein, it is preferable that a distance between the 3D structures formed on the transparent substrate be made short to thereby obtain a dense arrangement.

As described before, while the CNT solution is deposited into the portion of the transparent substrate where the 3D structure is not formed, most of CNT solution remaining on the upper face of the 3D structure can be removed by washing the upper face with deionized water or a solvent such as an organic solvent, or washing it in tapping manner.

That is, as can be seen from the photograph of FIG. 5, the CNTs are substantially removed from the 3D structure after washing with deionized water or a solvent such as an organic solvent, or washing in tapping manner.

While the present invention has been shown and described with reference to some exemplary embodiments thereof, it should be understood by those of ordinary skill in the art that various changes in form and detail may be made therein without departing from the spirit and scope of the present invention as defined by the appending claims.

What is claimed is:

1. A method of manufacturing a carbon nanotube film, the method comprising:
    forming a plurality of three-dimensional structures distant from each other on a transparent substrate; and
    depositing a carbon nanotube solution on the substrate with the plurality of three-dimensional structures formed thereon,
    wherein the carbon nanotube solution is deposited onto a portion of the transparent substrate where the three-dimensional structures are not formed.

2. The method of manufacturing the carbon nanotube film according to claim 1, wherein the plurality of three-dimensional structures formed on the transparent substrate each includes one or more shapes selected from a group consisting of a cone, a semi-sphere, a polypyramid, and a cylinder.

3. The method of manufacturing the carbon nanotube film according to claim 1, wherein the surface of the three-dimensional structure formed is surface-treated with a material having an opposite polarity relative to the carbon nanotube solution to be deposited.

4. The method of manufacturing the carbon nanotube film according to claim 1, wherein a diameter of a contact portion between the three-dimensional structure formed on the transparent substrate and the transparent substrate amounts to a nano size.

5. The method of manufacturing the carbon nanotube film according to claim 1, further comprising removing the carbon nanotubes deposited on the surface of the three-dimensional structure after depositing a carbon nanotube solution on the substrate.

6. The method of manufacturing the carbon nanotube film according to claim 5, wherein removing the carbon nanotubes is performed by washing the carbon nanotubes in a tapping manner, or by washing them with deionized water or an organic solvent.

7. The method of manufacturing the carbon nanotube film according to claim 1, wherein the formation of the three-dimensional structure is performed by an imprint operation, a laser operation, an etching operation, or a photolithography operation.

8. The method of manufacturing the carbon nanotube film according to claim 1, wherein the carbon nanotube solution deposited is a solution dispersed in water or organic system.

9. The method of manufacturing the carbon nanotube film according to claim 8, wherein the carbon nanotube solution dispersed in water or organic system includes a dispersing agent.

* * * * *